United States Patent [19]

Polan et al.

[11] Patent Number: 4,468,293
[45] Date of Patent: Aug. 28, 1984

[54] ELECTROCHEMICAL TREATMENT OF COPPER FOR IMPROVING ITS BOND STRENGTH

[75] Inventors: Ned W. Polan, Madison; Chung-Yao Chao, Hamden, both of Conn.

[73] Assignee: Olin Corporation, New Haven, Conn.

[21] Appl. No.: 460,630

[22] Filed: Jan. 24, 1983

Related U.S. Application Data

[63] Continuation-in-part of Ser. No. 355,053, Mar. 5, 1982, abandoned.

[51] Int. Cl.³ .................. C25D 5/10; C25D 11/00
[52] U.S. Cl. ................................. 204/27; 156/151; 428/612; 428/675; 428/687; 204/140; 204/DIG. 9
[58] Field of Search ............... 204/27, 140, DIG. 9; 428/612, 675, 687; 156/151

[56] References Cited

U.S. PATENT DOCUMENTS

| | | | |
|---|---|---|---|
| Re. 30,180 | 12/1979 | Wolski et al. | 204/27 X |
| 3,220,897 | 11/1965 | Conley et al. | 204/27 X |
| 3,227,637 | 1/1966 | De Hart | 204/38 |
| 3,293,109 | 12/1966 | Luce et al. | 204/27 X |
| 3,322,656 | 5/1967 | Dahringer et al. | 204/38 |
| 3,328,275 | 6/1967 | Waterbury | 204/27 X |
| 3,454,376 | 7/1969 | Luce et al. | 204/27 X |
| 3,518,168 | 6/1970 | Byler et al. | 204/32 |
| 3,585,010 | 6/1971 | Luce et al. | 204/27 X |
| 3,674,656 | 7/1972 | Yates | 204/27 X |
| 3,699,018 | 10/1972 | Carlson | 204/52 R |
| 3,799,847 | 3/1974 | Vladimirovna et al. | 204/13 |
| 3,857,681 | 12/1974 | Yates et al. | 204/140 X |
| 3,857,766 | 12/1974 | Woods | 204/58 |
| 3,918,926 | 11/1975 | Wolski et al. | 204/27 X |
| 3,959,088 | 5/1976 | Sullivan | 204/14 R |
| 4,010,005 | 3/1977 | Morisaki et al. | 204/16 |
| 4,049,481 | 9/1977 | Morisaki | 204/140 X |
| 4,061,837 | 12/1977 | Hutkin | 204/27 X |
| 4,082,591 | 4/1978 | Morisaki et al. | 204/37 T |
| 4,140,599 | 2/1979 | Yamasaki et al. | 204/27 X |
| 4,169,018 | 9/1979 | Berdan et al. | 204/27 X |

FOREIGN PATENT DOCUMENTS

| | | |
|---|---|---|
| 1060075 | 6/1959 | Fed. Rep. of Germany . |
| 1496748 | 12/1963 | Fed. Rep. of Germany . |
| 2500160 | 8/1965 | Fed. Rep. of Germany . |
| 2739427 | 1/1967 | Fed. Rep. of Germany . |
| 134785 | 7/1958 | German Democratic Rep. . |
| 112145 | 3/1959 | German Democratic Rep. . |
| 591783 | 8/1947 | United Kingdom . |
| 757892 | 4/1960 | United Kingdom . |
| 928267 | 6/1963 | United Kingdom . |
| 943872 | 12/1963 | United Kingdom . |
| 1211494 | 2/1973 | United Kingdom . |
| 1333254 | 10/1973 | United Kingdom . |
| 1349696 | 4/1974 | United Kingdom . |
| 1396436 | 6/1975 | United Kingdom . |
| 1515361 | 11/1977 | United Kingdom . |
| 1529187 | 6/1978 | United Kingdom . |
| 1543301 | 4/1979 | United Kingdom . |
| 1548550 | 7/1979 | United Kingdom . |
| 2073779 | 4/1980 | United Kingdom . |
| 2073778 | 4/1980 | United Kingdom . |

OTHER PUBLICATIONS

"Periodic Reverse Current Process in Electroplating Using Acid Copper Electrolytes" by J. Mann, Transactions of the Institute of Metal Finishing, 1978, vol. 56, pp. 70-74.
"Electroplating with Current Pulses in the Microsecond Range" by V. A. Lamb, Plating, vol. 56, No. 8, Aug., 1969, pp. 909-913.
"Electroplating", by Lowenheim, McGraw-Hill Book Company, 1978, pp. 160-163.

Primary Examiner—John F. Niebling
Attorney, Agent, or Firm—Barry L. Kelmachter; Howard M. Cohn; Paul Weinstein

[57] ABSTRACT

A process and apparatus for treating a metal foil to enhance its ability to be bonded to a substrate comprise immersing the metal foil in an electrolytic cell having an electrolyte bath solution containing copper and applying a current having regularly recurring pulses and preferably flowing in only one direction to the cell. The current causes a dendritic layer of copper to be deposited on at least one surface of the metal foil at a first current density and bonded thereto at a second current density. The process and apparatus are particularly suited for treating copper foil.

20 Claims, 6 Drawing Figures

ELECTROCHEMICAL TREATMENT OF COPPER FOR IMPROVING ITS BOND STRENGTH

This application is a continuation-in-part of U.S. patent application Ser. No. 355,053 filed Mar. 5, 1982 now abandoned.

This invention relates to an improved process and apparatus for treating a surface of a metallic sheet or foil to enhance its ability to adhere to a substrate material. More particularly, a surface of a copper sheet or foil is treated to improve its ability to adhere to a resinous substrate.

Printed circuits are widely used in various electronic devices such as radios, televisions, electronic computers, etc. In the production of printed circuits, it is desirable to use copper, preferably in a foil form, because of copper's high electrical conductivity. Furthermore, where copper foil is carefully made and contains minimal elemental impurities, electrical conductivity is very uniform over the extent of the electrical connection between two points.

In producing printed circuits, it is a common practice to bond metal foil to a substrate material, generally a synthetic polymer, with an adhesive and to subject the composite structure to an acid etching treatment to form the desired circuit. However, because the adhesion between the metal foil and the substrate is weak, considerable effort has been directed in the past to treating the metal foil so as to increase its bond strength with the substrate. As a result of such efforts, a variety of treatments have been developed which result in the formation of a roughened surface on at least one surface of the metal foil. When the metal foil being used is a copper foil, these treatments generally comprise electro-depositing a dendritic copper layer on the surface so that when coated with a hardenable plastic material, the treated surface will form a tenacious bond, primarily a mechanical bond.

One type of prior art treatment for improving bond strength comprises processes having multiple electrodeposition steps. One step of these processes generally comprises applying by electrodeposition a nodular powdery copper layer, primarily copper or copper oxide particles, on a surface of a metal foil. The particles form into random nodular clusters which increase the foil surface area. After applying the nodular layer, at least one overlocking layer of copper or other metal such as nickel, cobalt or chromium, which is not nodular in structure but which instead conforms to the configuration of the first layer, is applied by a second electrodeposition step to provide a roughened surface while reducing the powder transfer characteristics of the nodular copper layer. This overlocking layer acts as an encapsulating coating to maintain the configuration of the surface projections intact. Typical of these treatments are those shown in U.S. Pat. Nos. 3,293,109 to Luce et al., 3,857,681 to Yates et al., 3,918,926 to Wolski et al., U.S. Reissue Pat. No. 30,180 to Wolski et al. and U.K. patent Specification Nos. 1,211,494 and 1,349,696 to Circuit Foil and Yates, respectively.

In some of the multi-electrodeposition step processes, another electrochemical treatment is applied after the step of forming the encapsulating layer. In one such treatment, the electrical treatment comprises using a metallic ion containing electrolyte under conditions such as to electrolytically deposit a third microcrystalline layer onto the surface being treated for further increasing its bond strength. In yet another type of treatment, a metallic barrier is formed electrolytically between the treated metal foil and the substrate material. This metallic barrier is intended to prevent any interaction between the substrate and the underlying treated metal foil during the laminating process. Within the prior art, it is known to form this metallic layer from materials such as zinc, indium, nickel, tin, cobalt, brass, bronze, codeposited tin and zinc, chromium, aluminum, cadmium, cadmium alloys of tin, zinc or copper, and phosphorous-containing nickel. Typical of these types of treatments are those shown in U.S. Pat. Nos. 3,585,010 to Luce et al., 3,857,681 to Yates et al., 3,918,926 to Wolski et al., 4,049,481 to Morisaki, 4,061,837 to Hutkin and 4,082,591 to Morisaki et al., U.S. Reissue Pat. No. 30,180 to Wolski et al., and U.K. patent application Nos. 2,073,778A and 2,073,779A, both to Furukawa.

Some of these prior art processes require that the various steps be carried out in either separate treatment tanks as part of a series operation or in one tank with solution draining between the steps. By having to use either a plurality of tanks or solution draining between the steps, these processes tend to be inefficient and complex.

In some of the prior art processes, use of a variable current density is suggested. For example, in the Luce et al. (109) patent, a high current density is used to deposit the dendritic layer. After the dendritic layer has been deposited, a lower current density is used to apply the encapsulating layer. The surface being treated is exposed to the high current density once and to the low current density once. In this sense, these prior art treatments are single cycle treatments.

It is also known in the prior art to form treated metal foil by electrodepositing copper foil onto a rotating drum at a first current density and thereafter applying a second current density to form a dendritic structure on the foil while it is still on the drum. It is also known that an overlocking layer could be formed on such a dendritic layer by applying yet a third current density to the metal foil on the drum. This type of approach for forming treated metal foil is illustrated in U.S. Pat. Nos. 3,674,656 to Yates and 3,799,847 to Valdimirovna et al. and U.K. Pat. Nos. 1,543,301 and 1,548,550.

Although these multi-electrodeposition step treatments are capable of providing a foil with a dendritic outer surface, they do have the drawback of requiring close control and regulation between the steps. Not only does each step need careful monitoring, but process variables of each step, such as bath composition, current density, bath temperature, etc. must be carefully coordinated with those of each other step. For example, if a two step process is used in which the bath position is changed in the second step, close coordination is needed between bath composition and the other variables in the first step with the new bath composition of the second step. These control and coordination requirements do not yield a simple process. Even with careful control of these processes, their complexity often gives rise to reliability problems. Furthermore, the multiplicity of electrodeposition steps gives rise to the need for more space and equipment and the additional expense associated with them.

In an attempt to simplify the overall process for treating copper foil to improve its bondability to a substrate, several processes have been developed which utilize a single electrodeposition step to form a dendritic layer on the copper foil. U.S. Pat. Nos. 3,220,897 to Conley et al., 3,227,637 to DeHart, 3,322,656 to Dahringer et al., 3,328,275 to Waterbury, 3,454,376 to Luce et al., 3,518,168 to Byler et al., 3,699,018 to Carlson, and 4,010,005 to Morisaki and U.K. Pat. No. 928,267 to DuPont exemplify such processes. However, these processes frequently require additional treatments, bath agitation, and accurate control of the electrolyte bath composition, its temperature, and the current density being used. For example, in the Dahringer patent, the electrolytically formed layer is subsequently treated with a solution containing a solute characterized as being capable of forming with copper a compound which has low solubility in the solution. Two groups of solutes have been found to be effective in achieving an improvement in bonding quality. The first group consists of compounds capable of forming a sulfide, telluride or selenide with copper. The second group consists of weakly acidic solutions of compounds capable of forming a chromate, molybdate, tungstate or vanadate with copper.

In the Byler et al. patent, a cuprous cyanide bath is used to electrodeposit copper dendrites on a surface of a clean copper sheet. However, the use of cyanide bath solutions is not desirable because of toxicity and disposal problems.

Another approach for improving the bondability of copper to a substrate is to galvanically apply a coating of either cadmium or zinc to a surface of the copper. This approach is demonstrated in German Auslegeschrift No. 1,060,075 to Licentia. Yet another approach for improving the bondability of copper foil uses an improved copper electroplating method typically for use on a carrier material such as aluminum. The method comprises pretreatment of the carrier surface and electrodeposition of copper foil utilizing an acidic plating bath containing copper, nitrate or fluoride ions which can be operated at a single current density. This process is exemplified by U.S. Pat. No. 4,169,018 to Berdan et al.

It is also known in the prior art to use different types of current wave forms for electrodeposition. Electroplating, by Lowenheim, McGraw-Hill Book Co., 1978, pp. 160–163 discloses several forms of plating currents. One form is known as periodic reverse. Here, the direct current is made to change direction at preset intervals so that for part of the cycle electrodeposition occurs and for another part of the cycle deplating occurs. The more deplating that takes place as compared to electrodeposition, the more sacrificial the cycle is said to be. In order to make this type of system worthwhile, the loss in overall efficiency caused by the reverse cycle must be compensated by some improvement in the character of the deposit or of some other variable in the system. A discussion of the various considerations involved in using a periodic reverse current process to plate copper can be found in the article "Periodic Reverse Current Process in Electroplating Using Acid Copper Electrolytes", by J. Mann, Transactions of the Institute of Metal Finishing, Vol. 56, 1978, pp. 70–74.

Another form is known as pulse current plating. In pulse current plating, the current is interrupted for certain periods of time. During these time periods, the current density generally goes to zero. It is known in the prior art to electrodeposit copper using the pulsed current approach. German Democratic Republic Patentschrift No. 134,785 to Skilandat et al., U.K. Pat. No. 1,529,187 to Inoue-Japax Research, Inc. and the article "Electroplating with Current Pulses in the Microsecond Range", by V. A. Lamb, Plating, August 1969, pp. 909–913 illustrate a pulsed current approach for electrodepositing copper.

The utilization of pulsed current in the electroplating of metals has not yet met with any degree of commercial success primarily because of the relatively low amperage available at the plating cell. One suggested approach for overcoming this deficiency is to use an electronic switching method for converting the flow of current from an AC line source to periodic DC pulses to increase the peak amperages. In order that the rate of plating deposit may be increased, a conventional DC power source supply may also be incorporated into the circuit. Such a circuit is illustrated in U.S. Pat. No. 3,959,088 to Sullivan.

German Democratic Republic Patentschrift No. 112,145 to Schmidt et al. illustrates a variation of the pulse plating technique for forming dendritic structures on metal foil. This variation comprises passing metal foil through an electrolyte bath and subjecting the metal foil to a plurality of current pulses of relatively high current density superimposed over a relatively low base current density. The superimposed high current density pulses create a disturbed layer growth that leads to the development of nodular growth structures on the foil. Schmidt et al. suggest that the metal foil be subjected to 2–10 pulses. For each pulse, the foil is exposed to the high current density for a time period in the range of 0.1 to 10 seconds.

One of the deficiencies of the Schmidt et al. process is the production of relatively long nodular or dendritic structures. These relatively long dendritic structures can break off during the laminating process and become enclosed by the resin of the substrate. This latter problem is known in the prior art as a mechanical type of staining. The relatively long dendritic structures produced by the Schmidt et al. process also have negative consequences with respect to etchability and resistance to abrasion. The dendritic structures produced by the Schmidt et al. process may extend far into the substrate material leading to long etching times and to strong undercuts which reduce the dimensional accuracy of the etching.

The invention described herein embodies a single step electrochemical process and apparatus for treating metal to enhance its ability to adhere to a substrate, particularly a non-metallic substrate. Metal treated by the process of the instant invention exhibit superior resistance to stress and wear, e.g. mechanical staining, and improved peel strength and powder transfer characteristics as a result of better structured dendrites being formed on the metal surface. In addition, the process described herein may be accomplished more rapidly, more conveniently and with the consumption of less energy than prior art practices.

In accordance with the invention described herein, an electrochemical process and apparatus for treating copper sheet or foil to produce an adherent nodularized or dendritic surface structure which allows the sheet or foil to be securely bonded to a non-metallic substrate utilizes a multi-cycle fluctuating current to simultaneously form the dendritic surface structure and bond it to the underlying copper sheet or foil in a single operation. The fluctuating current preferably flows in only one direction and has regularly recurring pulses and a cathodic portion with first and second current densities each having a magnitude greater than zero. Preferably, an uninterrupted current is utilized.

More particularly, an electrolytic bath comprising a copper sulfate-sulfuric acid solution is maintained in an electrochemical cell. The cell has an anode and a cathode. The cathode comprises the copper sheet or foil upon which the dendrites are to be deposited. Current is applied across the cell either by a constant current source and a function generator or a constant voltage source and a function generator. The applied current preferably has a suitable wave form, such as a square wave, a triangular wave, a sinusoidal wave, etc. The applied current causes clusters of copper particles to be deposited on and bonded to the copper sheet or foil. These clusters of copper particles from the dendrites. They generally have a relatively fine structure which is highly desirable. It is believed that the relatively fine dendritic structure is a result of the initiation of many nucleation sites during an initial current pulse and the renucleation of the dendritic structures each time there is another current pulse. In addition, undesirable columnar structures are avoided by not exposing the dendritic structures to relatively long periods of time at current densities above the limiting current density. After the sheet or foil has been treated in accordance with the instant invention, it may be laminated to a non-metallic substrate so as to form, for example, a printed circuit laminate.

It has been found that by using the more efficient and simpler process and apparatus of the instant invention, a laminate having a peel strength as great or greater than that typically produced by the prior art treatments can be formed. Peel strength is a conventionally used term to refer to the strength of the bond between the foil and the non-metallic substrate.

Accordingly, it is an object of the present invention to provide an improved process and apparatus for treating metallic sheet or foil.

Another object of the present invention is to provide an improved process and apparatus as above which enhances the ability of sheet or foil to adhere to a non-metallic substrate.

Yet another object of the present invention is to provide an improved process and apparatus as above which treats the sheet or foil more rapidly, more conveniently and with the consumption of less energy.

Yet another object of the present invention is to provide an improved process and apparatus as above which uses a single electrochemical step to form and bond a dendritic layer to a metal sheet or foil.

Yet another object of the present invention is to provide an improved process and apparatus as above for forming a relatively fine dendritic structure on metal sheet or foil and thereby impart improved peel strength, wear resistance and resistance to mechanical staining to the sheet or foil.

These and other objects of the present invention will become more apparent from the following description and drawings.

In accordance with this invention, a process and apparatus for electrolytically treating a metal sheet or foil for enhancing its ability to adhere to a substrate, particularly a non-metallic substrate, are provided. Although applicable to many metals or alloys, the apparatus and process of the instant invention are particularly useful for treating sheet or foil made of copper and copper alloys. Laminates having high peel strengths, which are particularly suitable for printed circuit applications, can be achieved through the use of the process and apparatus of the instant invention.

Figure 1:
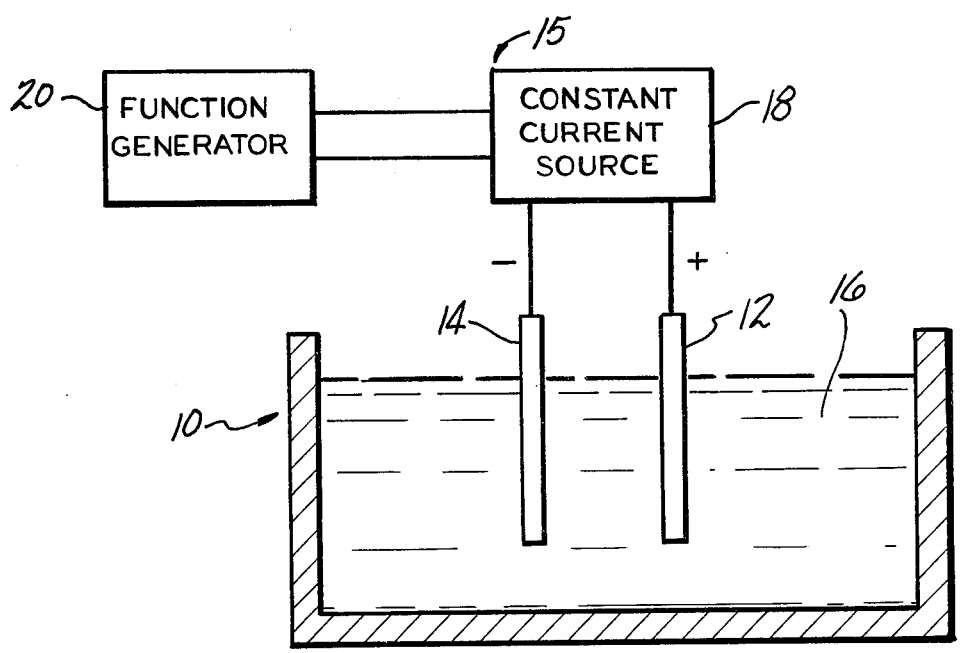
FIG. 1 is a schematic illustration of an apparatus in accordance with the instant invention.

Referring now to FIG. 1, the apparatus of the instant invention comprises an electrolytic cell 10 having an anode 12, a cathode 14 and an electrolytic bath solution 16. The anode 12 and cathode 14 are connected to a system 15 for applying a current having a desired waveform.

The cathode 14 comprises the sheet or foil upon which a dendritic layer of copper particles is to be deposited. The sheet or foil is very thin and preferably comprises printed circuit grade copper. The sheet or foil may be held against a mechanical drum not shown in a manner well known in the art and may be pulled through the solution by any conventional pulling mechanism not shown as is known in the art. The mechanical drum assists in pulling the sheet or foil through the solution. The sheet or foil is preferably electrically insulated from and not bonded to the mechanical drum. In lieu of the mechanical drum and pulling mechanism, the sheet or foil may be attached to a temporary carrier such as a strip of aluminum, copper, iron, nickel, or any other suitable electrically conductive metal and immersed in the solution 16 by any suitable conventional means not shown. Ultimately, the sheet or foil is removed from the carrier after the dendritic layer has been deposited. If treatment of two surfaces of the sheet or foil is desired, the sheet or foil itself may be immersed in the bath solution without a support structure such as a carrier, a drum, etc.

Any suitable electrically conductive metal may be used for anode 12. Preferably, anode 12 comprises either lead or platinum or alloys thereof. Anode 12 is spaced a suitable distance from cathode 14.

The electrolytic bath solution 16 comprises a solution containing copper. In a preferred embodiment, a copper sulfate-sulfuric acid solution is used. The solution is preferably maintained either substantially at room temperature or at a slightly elevated temperature. When maintained substantially at room temperature, the solution preferably has a concentration of copper, in the form of copper sulfate, from about 10 grams/liter, hereinafter g/l, to a saturation concentration at room temperature of about 60 g/l. Below a copper concentration of about 10 g/l, the current efficiency becomes too low to reasonably perform the process of the instant invention. Above the saturation point, the copper sulfate precipitates and it becomes substantially impossible to get more copper into the solution. In a preferred embodiment, the concentration of copper in the solution 16 at room temperature is in a range of about 15 g/l to about 40 g/l.

The sulfuric acid in the solution 16 may have a concentration up to that which causes copper to precipitate out as copper sulfate. In a preferred embodiment, the concentration of sulfuric acid is about 10 g/l to about 100 g/l for a solution substantially at room temperature.

It should be recognized that the copper and sulfuric acid concentrations are dependent upon the temperature of the bath solution. If desired, cell 10 may be provided with any well-known, conventional means not shown as are known in the art for maintaining the temperature of the bath solution at a desired level. The copper and sulfuric acid concentrations discussed above may be adjusted if the solution 16 is maintained at a temperature other than room temperature. At elevated temperatures, the concentration of copper could be proportionately higher as the solubility limit increases with temperature.

Figure 2:
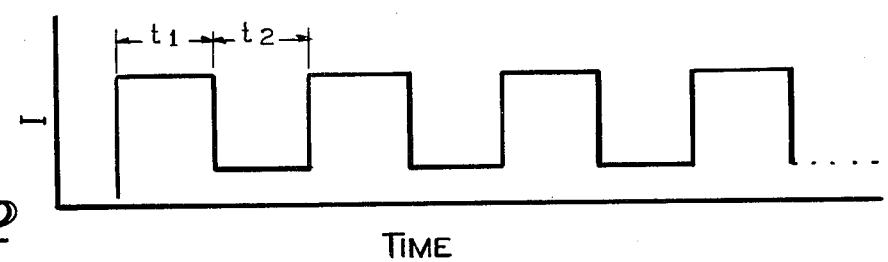
FIG. 2 is an illustration of a current waveform which can be used by the instant invention.
Figure 3:
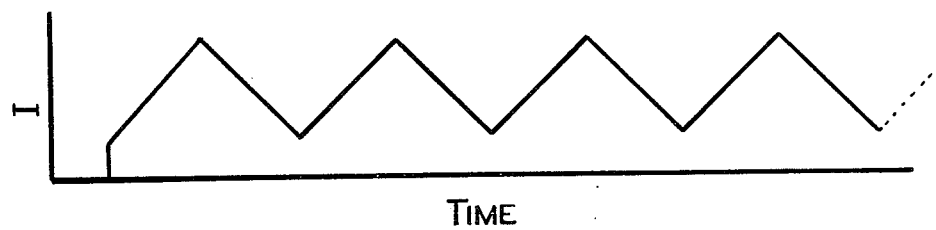
FIG. 3 is an illustration of an alternative current waveform which can be used by the instant invention.
Figure 4:
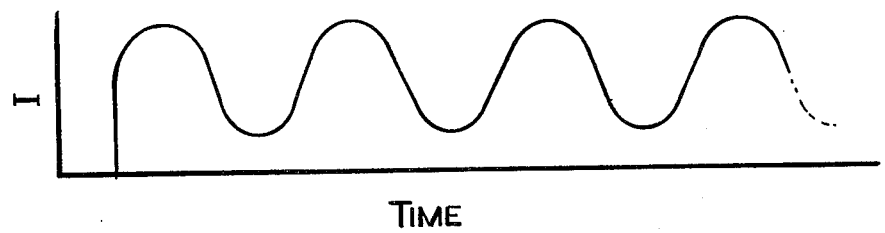
FIG. 4 is an illustration of yet another current waveform which can be used by the instant invention.

The current applying system 15 preferably comprises a constant d-c current source 18 and a function generator 20. The function generator 20 provides the current applied to the cell 10 with a desired waveform. The current applied to the cell 10 is preferably an uninterrupted, multi-cycle, fluctuating current having a cathodic portion with first and second current densities each with a magnitude greater than zero and flowing in only one direction. As shown in FIGS. 2–4, the applied current is a non-zero base cathodic current in which the second current density is also the base current density. Any suitable current waveform, such as the square waveform shown on FIG. 2, the triangular waveform shown in FIG. 3, and the sinusoidal waveform shown in FIG. 4 may be used as long as it has a cathodic portion with first and second current densities having a magnitude greater than zero. The constant current source 18 and the function generator 20 may comprise, respectively, any conventional constant current source and function generator as are known in the art.

The current applied across the cell 10 preferably has a cathodic portion with a current density which has a first magnitude for a first period of time $t_1$ and a second magnitude for a second period of time $t_2$ during each cycle of the current. The applied current preferably flows only in one direction so that only electrodeposition takes place during the electrochemical treatment.

The current density required for producing a desired dendritic layer is dependent upon the concentration and the operating temperature of the bath solution 16. The first magnitude of the current density should be above the magnitude of the limiting current density while the second magnitude of the current density is preferably below the magnitude of the limiting current density. The limiting current density may be defined as the maximum current density at which the dischargeable metal species, in this case copper ions, is substantially depleted at the surface of the metal foil or sheet. If the solution temperature is raised, the current density used for the process of the instant invention would have to be raised accordingly. If the copper concentration were lowered or if the sulfuric acid concentration were increased, the required current density would be lower.

For a bath solution substantially at room temperature having the copper and sulfuric acid concentrations discussed above, the current has a cathodic portion with a first current density having a magnitude of about 55 milliamperes/cm$^2$, hereinafter mA/cm$^2$, to about 350 mA/cm$^2$ and a second current density having a magnitude of about 5 mA/cm$^2$ to about 50 mA/cm$^2$. In a preferred embodiment, the current has a first current density of about 150 mA/cm$^2$ to about 300 mA/cm$^2$ and a second current density of about 10 mA/cm$^2$ to about 40 mA/cm$^2$. At the first current density, copper particles from the solution are deposited on the surface of the cathode to form a dendritic layer. At the second current density, the dendrites are made to adhere to the surface of the copper foil or sheet. In performing the process of the instant invention, the dendrites are deposited upon the surface of the copper sheet or foil and made to adhere to the surface of the copper sheet or foil during a number of cycles of the current.

By depositing a dendritic layer of copper particles on a surface of a copper sheet or foil to be laminated to a substrate, the surface becomes more readily adherable to the substrate. This occurs because the particles forming the dendritic layer are characterized by highly irregular, knob-like projections which not only increase the exposed surface area, thereby improving adhesion, but also enhance the mechanical aspects of adhesion.

The current is preferably applied to the cell 10 at a desired frequency and for a desired period of time known as the deposition time. The frequency of the current determines the number of pulses to which the copper sheet or foil is subjected for a given period of time. Again, it should be noted that both the frequency and the deposition time are dependent upon the copper and sulfuric acid concentrations in the solution 16 and the temperature of the solution 16. The current frequency used should be sufficient to both form and bond the dendrites but not so high that the applied current essentially becomes a straight line DC current. For the aforementioned copper sulfate-sulfuric acid solution substantially at room temperature, the frequency is in the range of about 1 Hz to about 10,000 Hz, preferably from about 4 Hz to about 1,000 Hz, and most preferably from about 12 Hz to about 300 Hz.

The deposition time, as well as being dependent upon solution concentration and temperature, is dependent upon the current density magnitude. The lower the current density, the more time it takes to deposit sufficient copper on the foil or sheet to form the desired dendritic structure. The deposition time should be greater than that at which not enough copper is deposited out but less than that at which too much copper deposits out and creates long dendrites susceptible to being broken off. For the aforementioned solution concentrations substantially at room temperature and the aforementioned ranges of current density, the deposition time should be from about 2 seconds to about 60 seconds, preferably from about 5 seconds to about 30 seconds.

In performing the process of the instant invention, it is desirable to subject the sheet or foil to the first current density magnitude for relatively short periods of time. The time period $t_1$ for which the foil is subjected to the first or higher current density should be less than about 0.125 seconds, preferably less than about 0.1 seconds. For producing treated metal foil having superior wear and stress resistance, peel strength, and powder transfer characteristics, there appears to be a criticality to the time $t_1$ at the first current density and the frequency of the current. In a most preferred embodiment, the time $t_1$ at the first current density should be less than about 0.04 seconds. The number of cycles or pulses to which the sheet or foil is subjected should be greater than 10 pulses, e.g. 11 or more. Preferably, the sheet or foil is subjected to at least 25 pulses. By forming the dendritic structures in this manner, undesirable columnar structures may be avoided and finer structures may be generated. It is believed that by using this approach more nucleation sites occur initially and that the dendrites renucleate each time there is a pulse.

Figure 5:
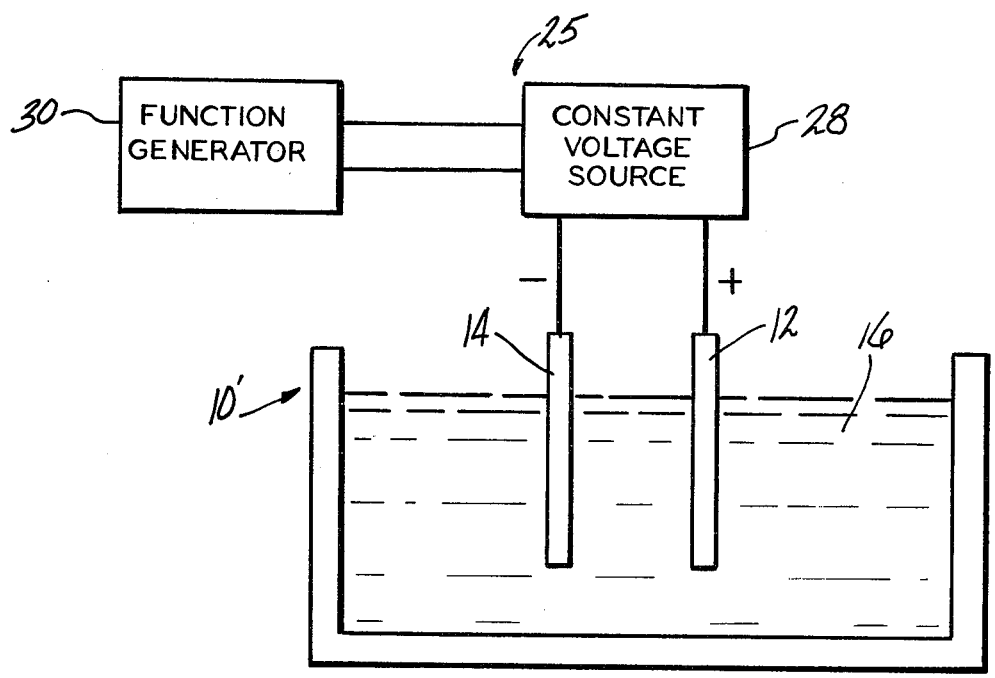
FIG. 5 is a schematic illustration of an alternative embodiment of an apparatus in accordance with the instant invention.

In lieu of the current applying system 15 of FIG. 1, it is possible to suitably deposit a plurality of dendrites on a metal foil surface utilizing a voltage control system. A suitable voltage control system 25 is shown in FIG. 5. The voltage control system 25 comprises a constant voltage source 28 and a function generator 30. Function generator 30 is used to provide the voltage with a desired waveform. The voltage waveform utilized should be capable of generating a current having a waveform with regularly recurring pulses, a desired frequency and a cathodic portion with a first current density having a first magnitude greater than zero and a second current density having a second magnitude less than the first magnitude but greater than zero. The voltage and current are applied to the cell 10' in the manner previously discussed. Cell 10' has an anode 12, a cathode 14 and a bath solution 16 such as those described hereinbefore.

The voltage applied to the cell 10' may have any suitable waveform such as a square waveform, a triangular waveform, a sinusoidal waveform, etc. Constant voltage source 28 and function generator 30 may comprise any conventional constant voltage source and function generator as are known in the art. The voltage control system 25 will obtain substantially the same result as the current applying system 15.

The process for treating the metal sheet or foil to enhance its ability to adhere to a substrate comprises placing the metal sheet or foil to be treated in an electrolytic cell containing an anode and an electrolytic bath solution containing copper. The sheet or foil comprises the cathode for the electrolytic cell. An uninterrupted, multi-cycle, fluctuating current having a cathodic portion with first and second current densities having magnitudes greater than zero and a waveform with regularly recurring pulses is applied across the cell, preferably in a single direction only. The fluctuating current is applied for a time sufficient to deposit copper from the bath solution onto at least one surface of the copper sheet or foil. The deposited copper takes the form of a plurality of dendrites firmly bonded to the sheet or foil surface. Preferably, the dendrites have relatively large knob-like projections at one end. After the electrodeposition treatment has been completed, the treated copper sheet or foil is removed and rinsed with a suitable liquid, e.g. water.

The treated sheet or foil may be laminated to a substrate using any well-known bonding method such as a pressure and heat treatment. The substrate to which the foil or sheet is to be bonded will vary depending upon the use for which the laminate is intended and the service conditions under which such laminate will be used. Particularly appropriate substrates which adapt the laminate for use in forming printed circuits include epoxy-resin-impregnated FIBERGLAS supports, epoxy-impregnated paper, phenolic resin impregnated paper and the like. The substrate may also comprise both flexible and non-flexible supports such as polytetrafluoroethylene-impregnated FIBERGLAS, fluorocarbonimpregnated FIBERGLAS, MYLAR and the like. Other flexible substrates include polyimides such as that known under the designation KAPTON and manufactured by DuPont.

If a pressure and heat treatment is used to bond the treated sheet or foil to a substrate, the pressure and heat should cause the substrate material or substrate coating to flow into the spaces formed by the dendrites and thereby improve the strength of the bond.

If desired, a layer of zinc, brass, nickel or any other suitable material may be formed over the dendrites to preclude problems associated with bonding copper to certain types of substrate material. Any well-known conventional apparatus and method for applying this layer to the dendritic layer may be used.

In order that the invention may be more fully understood, the following examples are given by way of illustrations:

EXAMPLE I

An electrolytic bath solution containing 20 g/l of copper, as copper sulfate, and 45 g/l of sulfuric acid was prepared. A 2 oz/ft$^2$ wrought C11000 copper foil was used as the cathode. The electrolytic cell was provided with a platinum anode spaced about one inch from the cathode. A fluctuating current having a rectangular waveform, such as that shown in FIG. 2, and a frequency of 1020 Hz was applied across the cell. The fluctuating current had a cathodic portion with a first current density of 200 mA/cm$^2$ for a first time period of $4.9 \times 10^{-4}$ sec and a second current density of 25 mA/cm$^2$ for a second period of time equal to the first period of time. The deposition time was 20 seconds. After treatment, the copper foil was removed from the cell and rinsed.

The foil was then laminated under heat and pressure to FIBERGLAS impregnated with epoxy resin following commonly accepted procedures to form a standard FR-4 rigid printed circuit laminate. The peel strength of this laminate was measured according to the Institute for Interconnecting and Packaging Electronic Circuits Standard Test Method 2.4.8 and was found to be equal to 12 to 13 lb./in.

EXAMPLE II

Identical treatments to that disclosed in Example I were performed except that the fluctuating current had a frequency of 4 Hz. Peel strength values of 8 to 10 lb./in. were obtained.

EXAMPLE III

Identical treatments to that disclosed in Example I were performed for a deposition time of 10 seconds at frequencies of 1020 Hz and 4 Hz. Peel strengths of 8 and 6 lb./in., respectively, were obtained.

EXAMPLE IV

Triangular and sinusoidal waveforms, such as those shown in FIGS. 3 and 4, were substituted for the rectangular waveform of Example I. The remainder of the process was identical to the process of Example I. For these waveforms, the peel strength was generally lower than that obtained in Examples I and II.

Accordingly, all of the above examples provide for a copper sheet or foil that when laminated, such as for printed circuit applications, has good peel strength. A dendritic layer for improving the adherability of the sheet or foil to a substrate is applied to the copper sheet or foil using a single step electrodeposition process which preferably is operated with an uninterrupted, multi-cycle, fluctuating current having a waveform with regularly recurring pulses and flowing in only one direction. The process of the instant invention permits formation of the dendrites and bonding of the dendrites to the foil surface at substantially the same time. The process of the instant invention also permits the use of current densities lower than those generally used in the prior art.

EXAMPLE V

To demonstrate the critical relationship between current frequency and the powder transfer characteristics exhibited by copper foil treated in accordance with the instant invention, a plurality of treated copper foil samples were prepared as follows. An electrolytic bath solution containing 20 g/l of copper, as copper sulfate, and 45 g/l of sulfuric acid was prepared. 2 oz/ft$^2$ wrought C11000 copper foil coupons were used as cathodes. The electrolytic cell was provided with a platinum anode spaced about one inch from the cathode. A fluctuating current having a waveform such as that shown in FIG. 2 was applied across the cell. The fluctuating current had a first current density of 200 mA/cm$^2$ and a second current density of 25 mA/cm$^2$. The first and second current densities were applied for the same period of time. The current was applied at frequencies of 0.25, 1, 4, 16, 64, 256 and 1024 Hz for a deposition time of 15 seconds. After each treatment, the copper foil coupon was removed from the cell, rinsed in water, dried, and weighed.

A piece of SCOTCH Magic Transparent Tape was pressed on each treated copper foil coupon and then peeled off by hand. A visual inspection of each tape was made to see if the transfer of metal took place. Thereafter, each treated copper foil coupon was weighed. If the weight change was negative, it meant that part of the dendritic treatment had been pulled from the foil. If the weight change was positive, it meant that adhesive had been pulled off the tape.

Figure 6:
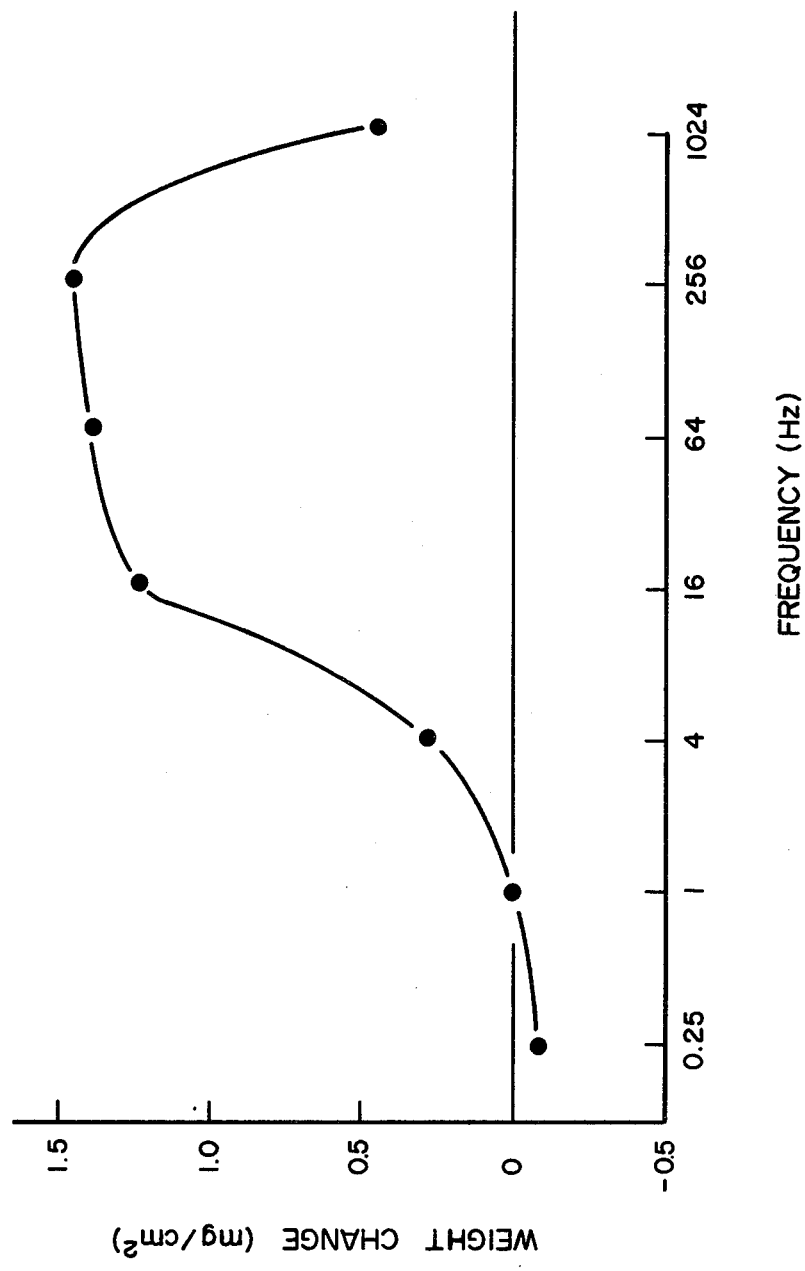
FIG. 6 is a graph showing the powder transfer characteristics of copper foil treated in accordance with the instant invention as a function of frequency.

The results of this test are shown in FIG. 6 where the weight change is plotted against current frequency. It can be seen from this figure that good results were obtained at frequencies in the range of 4 Hz to 1024 Hz and surprisingly superior results were obtained at current frequencies in the critical range of 12 Hz to 300 Hz.

Prior to being subjected to the process of the instant invention, the sheet or foil may be subjected to any suitable cleaning treatment known in the art. For example, it may be subjected to any type of electrolytic cleaning process, i.e. cathodic or anodic cleaning, and/or immersion in a sulfuric acid pickling solution.

While the instant invention has been described in terms of forming copper dendrites on copper sheet or foil, it may be used in conjunction with other metals such as nickel, zinc or chromium.

While it is preferred to maintain the bath solution 16 either substantially at room temperature or at a slightly elevated temperature, the process of the instant invention will also work at temperatures near the freezing temperature of the bath solution 16, e.g. about $-80°$ C. Typically the process will be performed with the bath solution at a temperature in the range of about 15° C. to about 50° C.

While the examples illustrate waveforms having a cathodic portion with a first current density for a first period of time and a second current density for a second period of time where the two periods of time are equal, it is possible to use waveforms having one time period greater than the other.

While an uninterrupted multi-cycle, fluctuating current flowing in only one direction is preferably utilized, other currents such as either an interrupted current or a periodic reverse current may be utilized.

While the invention has been described in terms of a particular copper sulfate-sulfuric acid electrolyte bath solution, the process of the instant invention could be performed using other types of electrolyte bath solutions.

While the instant process for treating copper sheet or foil has been described in terms of specific examples, the desired surface treatment can be obtained via a wide combination of fluctuating current densities, frequencies and waveforms and the instant invention should not be limited to those specified herein.

The patents and publications set forth in this application are intended to be incorporated by reference herein.

It is apparent that there has been provided in accordance with this invention an electrochemical treatment of copper for improving its bond strength which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to enhance all such alternatives, modifications, and variations as fall within the spirit and broad scope of the appended claims.

I claim:

1. A process for treating metal foil for enhancing its ability to adhere to a substrate, said process comprising:
    providing an electrolytic cell having an electrolytic bath solution containing a concentration of metal and an anode;
    immersing said foil as a cathode in said solution;
    providing a non-zero base cathodic current having a desired frequency and a desired waveform with recurring pulses, each said pulse comprising a first portion having a first current density for a first time period and a base portion having a second current density for a second time period, said first current density being greater than the limiting current density and substantially larger than said second current density, and said second current density being less than the limiting current density; and
    applying said current across said cell and subjecting said foil to a plurality of said current pulses having said first current density of each said pulse applied for less than about 0.1 seconds so that said metal from said solution is deposited onto said foil as a fine dendritic plating having improved peel strength, improved resistance to wear and stress, and improved powder transfer characteristics.

2. The process of claim 1 wherein said current applying step further comprises:
    subjecting said foil to a plurality of said current pulses having said first current density of each said pulse applied for less than about 0.04 seconds.

3. The process of claim 1 further comprising:
    subjecting said foil to greater than 10 current pulses.

4. The process of claim 1 further comprising:
    subjecting said foil to at least 25 current pulses.

5. The process of claim 1 wherein said electrolytic cell providing step further comprises:
    providing a bath solution having copper in a concentration of about 10 g/l to about 60 g/l and sulfuric acid in a concentration of about 10 g/l to about 100 g/l; and maintaining said bath solution substantially at room temperature, whereby said metal deposited onto said foil from said solution comprises said copper.

6. The process of claim 1 wherein said step of applying said current further comprises:

applying said current with said first current density being in the range of about 150 mA/cm² to about 300 mA/cm² and said second current density being in the range of about 10 mA/cm² to about 40 mA/cm².

7. The process of claim 1 wherein said current applying step further comprises:

applying said current with said frequency being in the range of about 4 Hz to about 1000 Hz.

8. The process of claim 1 wherein said current applying step further comprises:

applying said current with said frequency being in the range of about 12 Hz to about 300 Hz.

9. The process of claim 1 further comprising:

applying said current for a time in the range of about 2 seconds to about 60 seconds.

10. The process of claim 1 further comprising:

providing a constant current source and a function generator; and generating said current having said desired waveform and frequency with said constant current source and said function generator.

11. The process of claim 1 further comprising:

providing a constant voltage source and a function generator; and generating a voltage having a desired waveform and said current with said current voltage source and said function generator.

12. A process for treating metal foil for enhancing its ability to adhere to a substrate, said process comprising:

providing an electrolytic cell having an electrolytic bath solution containing a concentration of metal and an anode;

immersing said foil as a cathode in said solution;

providing a non-zero base cathodic current having a desired frequency and a desired waveform with recurring pulses, each said pulse comprising a first portion having a first current density for a first time period and a base portion having a second current density for a second time period, said first current density being greater than the limiting current density and substantially larger than said second current density, said second current density being less than the limiting current density; and applying said current across said cell and subjecting said foil to more than 10 of said pulses with said first current density of each pulse being applied for less than about 0.125 seconds so that said metal from said solution is deposited onto said foil as a fine dendritic plating having improved peel strength, improved resistance to wear and stress, and improved powder transfer characteristics.

13. The process of claim 12 wherein said current applying step further comprises:

subjecting said foil to at least 25 of said pulses.

14. The process of claim 12 wherein said electrolytic cell providing step further comprises:

providing a bath solution having copper in a concentration of about 10 g/l to about 60 g/l and sulfuric acid in a concentration of about 10 g/l to about 100 g/l; and maintaining said bath solution substantially at room temperature, whereby said metal deposited onto said foil from said solution comprises said copper.

15. The process of claim 12 wherein said step of applying said current further comprises:

applying said current with said first current density being in the range of about 150 mA/cm² to about 300 mA/cm² and said second current density being in the range of about 10 mA/cm² to about 40 mA/cm².

16. The process of claim 12 wherein said current applying step further comprises:

applying said current with said frequency being in the range of about 4 Hz to about 1000 Hz.

17. The process of claim 12 wherein said current applying step further comprises:

applying said current with said frequency being in the range of about 12 Hz to about 300 Hz.

18. The process of claim 12 further comprising:

applying said current for a time in the range of about 2 seconds to about 60 seconds.

19. A treated metal foil having improved ability to adhere to a substrate, said treated foil comprising:

a metal foil having a fine dendritic plating on one of its surfaces;

said dendritic plating comprising a plurality of metalic dendrites firmly bonded to said foil so as to provide said foil with improved peel strength, improved resistance to wear and stress, and improved powder transfer characteristics; and said dendritic plating being applied to the metal foil by the process of claim 1.

20. A treated metal foil having improved ability to adhere to a substrate, said treated foil comprising:

a metal foil having a fine dendritic plating on one of its surfaces;

said dendritic plating comprising a plurality of metallic dendrites firmly bonded to said foil so as to provide said foil with improved peel strength, improved resistance to wear and stress, and improved powder transfer characteristics; and said dendritic plating being applied to the metal foil by the process of claim 12.

* * * * *